United States Patent
Maruno et al.

(10) Patent No.: US 7,182,977 B2
(45) Date of Patent: *Feb. 27, 2007

(54) COMPOSITE SUBSTANCE CONTAINING METAL PARTICLES, CONDUCTIVE PASTE AND MANUFACTURING METHOD THEREOF

(75) Inventors: Tetsuji Maruno, Tokyo (JP); Kazuhiko Oda, Tokyo (JP); Akira Sasaki, Tokyo (JP); Kouji Tanaka, Tokyo (JP)

(73) Assignee: TDK Corporation, Tokyo (JP)

( * ) Notice: Subject to any disclaimer, the term of this patent is extended or adjusted under 35 U.S.C. 154(b) by 482 days.

This patent is subject to a terminal disclaimer.

(21) Appl. No.: 10/218,318

(22) Filed: Aug. 15, 2002

(65) Prior Publication Data
US 2003/0042469 A1    Mar. 6, 2003

(30) Foreign Application Priority Data
Aug. 21, 2001   (JP)   ............................ 2001-250909

(51) Int. Cl.
*B05D 7/00* (2006.01)
*B29B 9/00* (2006.01)
*H01B 1/22* (2006.01)
*H05K 1/09* (2006.01)

(52) U.S. Cl. ................... 427/212; 427/213.3; 427/216; 427/220; 252/500; 252/514; 252/518.1; 252/519.1; 252/511; 428/357; 428/402; 428/402.24; 75/343; 75/374; 75/362

(58) Field of Classification Search ............... 252/500, 252/503, 511, 514, 518.1, 519.3; 427/207.1, 427/212, 96, 216, 220; 428/357
See application file for complete search history.

(56) References Cited

U.S. PATENT DOCUMENTS 3,885,995 A * 5/1975 Lutz et al. ..................... 75/370
5,366,760 A * 11/1994 Fujii et al. .................. 427/98.4

(Continued)

FOREIGN PATENT DOCUMENTS

JP    4-365806    12/1992

(Continued)

OTHER PUBLICATIONS

Data Sheets, Mitsui Mining and Smelting Co., 2-pages, 2005.*

(Continued)

*Primary Examiner*—Mark Kopec
*Assistant Examiner*—Kallambella Vijayakumar
(74) *Attorney, Agent, or Firm*—Oblon, Spivak, McClelland, Maier & Neustadt, P.C.

(57) ABSTRACT

A composite substance for forming a conductive paste, comprises a solvent and metal or metal compound particles. The solvent is compatible with an organic component included in the conductive paste, and the metal or metal compound particles are dried metal or metal compound particles having the second solvent adhering to the surface thereof. The conductive paste comprises an organic vehicle, a solvent, and the composite substance which is mixed with the organic vehicle and the solvent. The method for manufacturing the composite substance comprises the steps of washing metal or metal compound particles with water, adding a solvent that is compatible with an organic component included in the conductive paste, thereby replacing water components, and drying the metal or metal compound particles having the solvent adhering to the surface thereof.

19 Claims, 1 Drawing Sheet

U.S. PATENT DOCUMENTS

| | | | |
|---|---|---|---|
| 5,622,547 A * | 4/1997 | Maslowski et al. | 524/313 |
| 5,840,268 A * | 11/1998 | Ikegami et al. | 423/592.1 |
| 6,533,966 B1 * | 3/2003 | Nonninger et al. | 252/520.1 |
| 6,585,796 B2 * | 7/2003 | Hosokura et al. | 75/373 |
| 6,620,220 B2 * | 9/2003 | Ito et al. | 75/362 |

FOREIGN PATENT DOCUMENTS

| | | |
|---|---|---|
| JP | 05-101708 | 4/1993 |
| JP | 8-246001 | 9/1996 |
| JP | 2000-45001 | 2/2000 |
| JP | 2000-48644 | 2/2000 |
| JP | 2000-048644 * | 2/2000 |
| JP | WO 01/57885 * | 2/2000 |
| JP | 2000-68106 | 3/2000 |
| JP | WO 01/057885 | 8/2001 |
| JP | WO 01/57885 * | 8/2001 |
| JP | 2001-357720 | 12/2001 |

OTHER PUBLICATIONS

"New Materials 1994", TRC R & D Library, TRC Co., Jan. 1994, pp. 264-265.

* cited by examiner

COMPOSITE SUBSTANCE CONTAINING METAL PARTICLES, CONDUCTIVE PASTE AND MANUFACTURING METHOD THEREOF

BACKGROUND OF THE INVENTION

1. Field of the Invention

The present invention relates to a composite substance containing metal particles for forming a conductive paste, a conductive paste and a manufacturing method thereof.

2. Discussion of Background

As the miniaturization of electronic devices has been pursued with more vigor in recent years, it has become crucial to provide more compact electronic components for use in such electronic devices. In particular, a great deal of effort has been made to achieve further miniaturization as well as an improvement in the characteristics, for electronic components such as inductors, capacitors and filters constituted of ceramic, by adopting a multilayer lamination structure.

These laminated components are manufactured by mixing ceramic powder with an organic vehicle, printing a conductive paste to constitute an electrode on a green sheet prepared through a means such as sheeting or printing, baking the green sheet assembly having undergone steps such as lamination, crimping and cutting and then forming external electrodes. The conductive paste is prepared by dispersing a specific type of metal powder into an organic vehicle and an organic solvent.

The various methods through which the metal powder used in the conductive paste is manufactured in the prior art include the gas-phase chemical reaction method, the precipitation reduction method, the reduction deposition method and the thermal reduction method. In any of these manufacturing methods, the metal powder is first washed with water and is then dried. The conductive paste is prepared by dispersing the dried metal powder into the organic vehicle and the organic solvent.

However, dried metal powder tends to aggregate easily, resulting in formation of aggregated metal particles having a particle size larger than the natural particle size of the metal powder. In particular, since increasingly fine metal powder is used nowadays to support the reduction in the film thickness of electrode films, such aggregations in the metal powder tend to occur more frequently.

A conductive paste prepared by dispersing aggregated metal powder into an organic vehicle and an organic solvent, contains large aggregated metal particles. If electrodes of electronic components are formed by using a conductive paste containing aggregated metal particles, the reliability and yield of the electronic components will be greatly compromised. For instance, as shown in FIG. 2, aggregated metal particles 11 may manifest at internal electrodes 1 formed at a ceramic laminated component. If the particle size of the aggregated metal particles 11 becomes larger than the film thickness of the internal electrodes 1, the ceramic 2 is greatly stressed in the area between the internal electrodes 1, resulting in a marked reduction in the reliability and a lower yield of the ceramic laminated component.

Since the aggregated metal particles can only be separated into metal particles having the original particle size through a longer mixing/dispersion step implemented in the conductive paste manufacturing process, poor process efficiency and increased production costs are bound to result.

In addition, while the metal powder is first mixed with the organic vehicle and the organic solvent and then is mixed and dispersed in the conductive paste by utilizing a triple roller in the prior art, the dispersion process implemented by using the triple roller involves various types of potential problems due to the mechanical structure of the triple roller and the process itself requires the worker to be highly experienced and skilled. Thus, it is a very complicated process that requires strict production management. Furthermore, since the dispersion step is a lengthy process, the production costs are bound to rise.

SUMMARY OF THE INVENTION

It is an object of the present invention to provide a composite substance and a conductive paste, in which metal particles do not become aggregated.

It is a further object of the present invention to provide a composite substance and a conductive paste that greatly improve the reliability and the yield of electronic components.

It is a still further object of the present invention to provide a method for manufacturing the composite substance and the conductive paste described above at low cost.

In order to achieve the objects described above, the composite substance for forming a conductive paste according to the present invention comprises a solvent and metal particles or metal compound particles. The solvent is compatible with an organic component to be contained in the conductive paste. The metal particles or metal compound particles (hereinafter referred to as "metal particles") are dried metal particles, and the solvent adheres to the surface thereof.

As discussed above, the composite substance for forming a conductive paste according to the present invention is such that a solvent that is compatible with the organic component to be contained in the conductive paste adheres to the surface of the dried metal particles, so good dispersibility can be ensured even if the metal particles are reduced in size to a size of 1.0 µm or smaller, for example to a size of 0.2 µm or smaller. Accordingly, the various problems arising from the dispersion of a metal powder are solved, and reliability and yield are markedly improved.

In addition to disallowing aggregation of metal particles, the composite substance can be disbursed into an organic vehicle and an organic solvent to achieve a conductive paste, in an extremely smooth, consistent and speedy manner since the solvent of the composite substance is compatible with the organic binder used to make the conductive paste. As a result, a great reduction can be achieved in the length of time required to mix and disperse the composite substance, thereby achieving an improvement in the process efficiency and a reduction in the production costs.

The composite substance for forming a conductive paste according to the present invention can be manufactured by adding a solvent that is compatible with the organic component to be contained in the conductive paste to the undried metal particles produced through washing with water, thereby replacing the water with the solvent, and then drying the particles.

The solvent added to the metal particles produced through washing with water is a slow-drying solvent, and adheres to the metal particles. The metal particles to which the solvent adheres therefore precipitates and are separated from the water.

The solvent used in the process of manufacturing the composite substance according to the present invention can be any known solvent of this type used in the past. Butyl-carbitol is an example of a solvent that may be used in this application. The solvent is added in an amount of 0.0025 to 0.02 g/m² with respect to the total surface area of the metal particle group. What this means is that if we look at just one metal particle, the solvent may adhere to substantially the entire surface of the metal particle, or it may adhere to just a portion of the metal particle surface.

The metal particles may be manufactured through any of the manufacturing methods adopted in the prior art such as a gas-phase chemical reaction method, a precipitation reduction method, a reduction deposition method and a thermal reduction method. The solvent is added immediately after washing with water, without drying the particles first, so as to replace the water, after which the particles are dried. There are hardly any restrictions imposed upon the material to constitute the metal particles adopting the present invention. The present invention may be widely adopted in conjunction with metal particles constituted of Ni, Cu, Ag, Ag/Pd, Pd, or alloys of these metals.

With the conductive paste manufacturing method according to the present invention, the above-mentioned composite substance is mixed with an organic component, and more specifically, an organic vehicle and a solvent.

DETAILED DESCRIPTION OF THE PREFERRED EMBODIMENTS

The following is a detailed description of the present invention, given in reference to embodiments. It is to be noted that the present invention is not limited by these examples.

EMBODIMENT 1 a. Method of Manufacturing Composite Substance

Ni metal particles obtained through the gas-phase chemical reaction method were washed with water and a slurry containing Ni metal particles a specific surface area of 1.7 m²/g was obtained. In this slurry, water was contained at a rate of 80 weight units relative to 100 weight units of the Ni metal particles.

Figure 1:
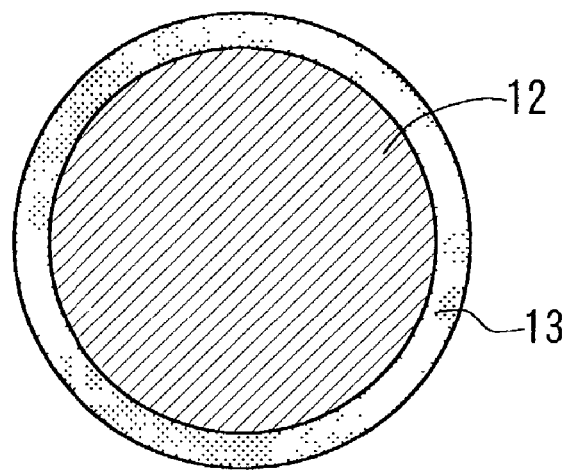
FIG. 1 schematically illustrates a state with a solvent adhering to dried metal particles having been washed with water in the manufacturing method according to the present invention.
Figure 2:
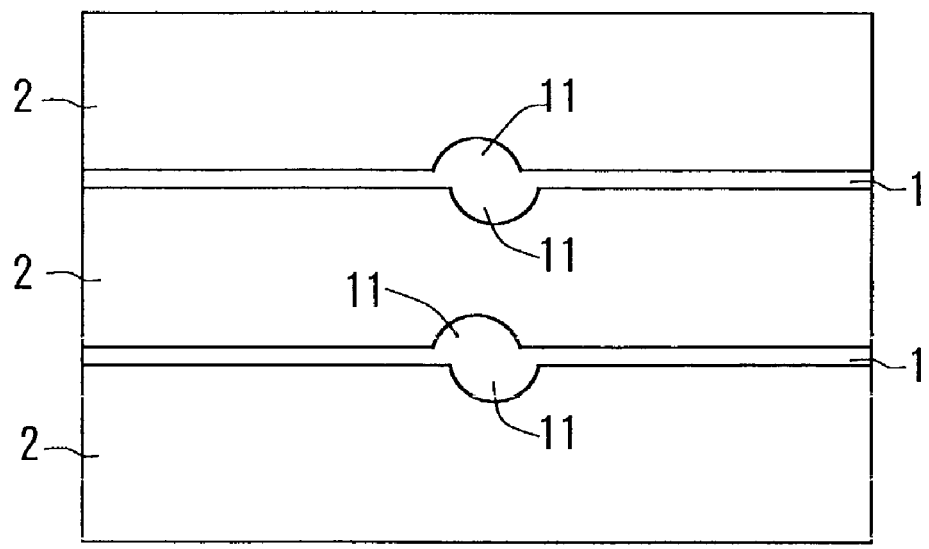
FIG. 2 is a diagram illustrating a problem encountered with prior art.

Butylcarbitol was mixed as a solvent into the above slurry in an amount of 0.2 to 0.7 weight part, which caused the Ni metal particles to agglomerate and precipitate out of the water. The slurry thus obtained contained 5 to 10 weight parts water per 100 weight parts Ni metal particles. In view of this, butylcarbitol was admixed as a solvent into this slurry in an amount of 0.2 to 2.5 weight parts in order to further promote the separation of water, after which this slurry was dried. This yielded an Ni composite substance in which butylcarbitol remained on the dried Ni metal particles. FIG. 1 is a diagram schematically illustrating this state, in which a solvent 13 adheres around a metal particle 12.

b. Method of Manufacturing Conductive Paste

A conductive paste was manufactured by using the composite substance containing metal particles obtained through the process described above and by adding and mixing in an organic binder and an organic solvent so as to achieve an Ni metal particle content of 50 wt % and a specific degree of viscosity. This conductive paste was formed into sheets through the doctor-blade method and the conductive paste sheeting was then dried. This conductive paste sheeting is referred to as test piece No. 1.

Comparative Example 1 a. Method of Manufacturing Composite Substance

Ni metal particles obtained through the gas-phase chemical reaction method were washed with water and then dried, thereby obtaining Ni metal particles (dried Ni metal powder) with a specific surface area of 1.7 m²/g.

b. Method of Manufacturing Conductive Paste

A conductive paste was manufactured by using the composite substance obtained through the process described above and by adding and mixing in an organic binder and an organic solvent so as to achieve an Ni metal particle content of 50 wt % and a specific degree of viscosity. This conductive paste was formed into sheets through the doctor-blade method and the conductive paste sheeting was then dried. This conductive paste sheeting is referred to as test piece No. 2.

Evaluation Method and Evaluation Results

The density and the surface roughness of dry sheets were evaluated for test pieces 1 and 2. The density of a dry sheet was evaluated by using a value obtained by cutting a dried sheet into specific dimensions and calculating the density in conformance to the volume and the weight of the cut piece.

The surface roughness of a dry sheet was measured for evaluation by using a surface roughness gauge (SURF-MU 570 A Ruby Terminal 0.8 mmR, manufactured by Tokyo Seimitsu Co. Ltd.). The results of the evaluation are presented in TABLE 1. Each numerical value in TABLE 1 represents the average among 10 sample pieces.

TABLE 1

| Sample No. | raw material form of Ni component | dry sheet density (g/cm³) | surface roughness Ra | surface roughness Rmax |
|---|---|---|---|---|
| 1 | solvent remaining on powder | 5.7 | 0.036 | 0.32 |
| 2 | dried powder | 5.3 | 0.06 | 0.54 |

As shown in TABLE 1, sample No. 1 obtained in Embodiment 1 of the present invention had a dry sheet surface roughness Ra and Rmax that were improved to only approximately 40% those of sample No. 2 obtained in Comparative Example 1, and thus, it can be concluded that an electrode film with an extremely smooth surface can be obtained by using test piece No. 1.

EMBODIMENT 2 a. Method of Manufacturing Composite Substance

Ag metal particles obtained through the precipitation and reduction process were washed with water to obtain a slurry containing water and Ag metal particles with a specific surface area of 3.6 m²/g. In this slurry, water was contained at a rate of 80 weight units relative to 100 weight units of the Ag metal particles.

Butylcarbitol was mixed as a solvent into the above slurry in an amount of 0.4 to 1.4 weight parts, which caused the Ag metal particles to agglomerate and precipitate out of the water. The slurry thus obtained contained 5 to 10 weight parts water per 100 weight parts Ag metal particles. In view of this, butylcarbitol was admixed as a solvent into this slurry in an amount of 0.4 to 5 weight parts in order to further promote the separation of water, after which this slurry was dried. This yielded an Ag composite substance in which butylcarbitol remained on the dried Ni metal particles.

b. Method of Manufacturing Conductive Paste

A conductive paste was manufactured by using the composite substance containing metal particles obtained through the process described above and by adding and mixing in an organic binder and an organic solvent so as to achieve an Ag metal particle content of 80 wt % and a specific degree of viscosity. This conductive paste was formed into sheets through the doctor-blade method and the conductive paste sheeting was then dried. This conductive paste sheeting is referred to as test piece No. 3.

Comparative Example 2 a. Method of Manufacturing Composite Substance

Ag metal particles obtained through the precipitation and reduction process were washed with water and then dried, which thereby obtaining Ag metal particles (dried Ag metal powder) with a specific surface area of 3.6 $m^2/g$.

b. Method of Manufacturing Conductive Paste

A conductive paste was manufactured by using the composite substance obtained through the process described above and by adding and mixing in an organic binder and an organic solvent so as to achieve an Ag metal particle content of 80 wt % and a specific degree of viscosity. This conductive paste was formed into sheets through the doctor-blade method and the conductive paste sheeting was then dried. This conductive paste sheeting is referred to as test piece No. 4.

Evaluation Method and Evaluation Results

The density and the surface roughness of dry sheets were evaluated for test pieces 3 and 4. The density of a dry sheet was evaluated by using a value obtained by cutting a dried sheet into specific dimensions and calculating the density in conformance to the volume and the weight of the cut piece. The surface roughness of a dry sheet was measured for evaluation by using a surface roughness gauge (SURF-MU 550 A Ruby Terminal 0.8 mmR, manufactured by Tokyo Seimitsu Co. Ltd.). The results of the evaluation are presented in TABLE 2. Each numerical value in TABLE 2 represents the average of 10 sample pieces.

TABLE 2

| Sample No. | raw material form of Ag component | dry sheet density (g/cm³) | surface roughness Ra | Rmax |
|---|---|---|---|---|
| 3 | solvent remaining on powder | 6.4 | 0.024 | 0.22 |
| 4 | dried powder | 5.8 | 0.04 | 0.43 |

As indicated in TABLE 2, the dry sheet surface roughness values Ra and Rmax of test piece No. 3 obtained through embodiment 2 of the present invention are approximately half the surface roughness values of test piece No. 4 presented as comparative example 2, and thus, it can be concluded that an electrode film with an extremely smooth surface can be obtained by using test piece No. 3.

EFFECTS OF THE INVENTION

As described above, the present invention achieves the following advantages.

(a) A composite substance and a conductive paste in which aggregation of metal particles is not induced are provided.

(b) A composite substance and a conductive paste with which the reliability and the yield of electronic components can be greatly improved are provided.

(c) Methods for manufacturing the composite substance and the conductive paste at low cost are provided.

What is claimed is:

1. A method for manufacturing a composite substance for forming a conductive paste, comprising:
   washing metal or metal compound particles with water to form an aqueous dispersion comprising one or more of the metal or the metal compound particles, and water;
   mixing a first portion of a solvent into the aqueous dispersion in an amount of 0.2 to 0.7 weight parts relative to 100 weight parts of the metal or the metal compound particles, thereby agglomerating and precipitating the metal or the metal compound particles, to form a first slurry comprising 5 to 10 parts by weight of water relative to 100 parts of the metal or the metal compound particles, wherein the solvent is compatible with an organic component present in the conductive paste; then
   mixing a second portion of the solvent into the first slurry in an amount of 0.2 to 2.5 weight parts relative to 100 weight parts of the metal or the metal compound particles, to form a second slurry, wherein the mixing of the second portion of the solvent with the first slurry replaces a residual part of the water adhered to the surface of the metal or the metal compound particles; and
   drying said metal or metal compound particles having said solvent adhering to the surface thereof.

2. The manufacturing method as in claim 1, wherein:
   said metal or metal compound particles have an average particle size of 1 µm or smaller.

3. The manufacturing method as in claim 1, wherein:
   said solvent is present in an amount of from 0.0025 to 0.02 g/m² with respect to the total surface area of the group of the metal or metal compound particles.

4. The manufacturing method as in claim 1, wherein:
   said solvent includes an organic vehicle.

5. The manufacturing method as in claim 1, wherein:
   said solvent has a boiling point of at least 150° C.

6. The method of claim 1, wherein the aqueous dispersion comprises at least 80 weight parts water relative to 100 weight parts of the metal or metal compound particles.

7. The method of claim 1, wherein the metal or metal compound particles obtained after drying have an average particle size of 0.2 µm or smaller.

8. The method of claim 1, wherein the second slurry obtained after removing the portion of the liquid from the first slurry contains from 5 to 10 weight parts of water per 100 weight parts of the metal or metal compound particles.

9. The method of claim 1, wherein the solvent is present on the metal or metal compound particles after drying.

10. The process of claim 1, further comprising
    manufacturing the metal or metal compound particles by a method selected from the group consisting of a gas-phase chemical reaction, a precipitation reduction, a reduction deposition and a thermal reduction.

11. The method of claim 1, wherein the metal or metal compound particles comprise at least one metal selected from the group consisting of Ni, Cu, Ag, Ag/Pd, Pd, and an alloy thereof.

12. The method of claim 1, wherein the solvent consists of butylcarbitol.

13. The method of claim 1, further comprising
mixing the dried metal or metal compound particles with an organic binder and a different organic solvent to form a conductive paste.

14. A method for manufacturing a composite substance for forming a conductive paste, comprising:
washing metal or metal compound particles with water to form an aqueous dispersion comprising one or more of the metal or the metal compound particles, and water;
mixing a first portion of a solvent into the aqueous dispersion in an amount of 0.2 to 0.7 weight parts relative to 100 weight parts of the metal or the metal compound particles, thereby agglomerating and precipitating the metal or the metal compound particles, to form a first slurry, wherein the solvent is compatible with an organic component present in the conductive paste; then
mixing a second portion of the solvent into the first slurry in an amount of 0.2 to 2.5 weight parts relative to 100 weight parts of the metal or the metal compound particles, to form a second slurry, wherein the mixing of the second portion of the solvent with the first slurry replaces a residual part of the water adhered to the surface of the metal or the metal compound particles; and
drying said metal or metal compound particles having said solvent adhering to the surface thereof.

15. The manufacturing method as in claim 14, wherein:
said metal or metal-compound particles have an average particle size of 1 µm or smaller.

16. The manufacturing method as in claim 14, wherein:
said solvent is present in an amount of from 0.0025 to 0.02 g/m$^2$ with respect to the total surface area of the group of the metal or metal-compound particles.

17. The manufacturing method as in claim 14, wherein:
said solvent includes an organic vehicle.

18. The manufacturing method as in claim 14, wherein:
said solvent has a boiling point of at least 150° C.

19. The manufacturing method as in claim 14, wherein:
said solvent consists of butylcarbitol.

* * * * *

UNITED STATES PATENT AND TRADEMARK OFFICE
CERTIFICATE OF CORRECTION

| | | |
|---|---|---|
| PATENT NO. | : 7,182,977 B2 | Page 1 of 1 |
| APPLICATION NO. | : 10/218318 | |
| DATED | : February 27, 2007 | |
| INVENTOR(S) | : Maruno et al. | |

It is certified that error appears in the above-identified patent and that said Letters Patent is hereby corrected as shown below:

On the title page, Item (45), the Terminal Disclaimer Information is incorrect. Item (45) should read:
-- [45] Date of Patent:    Feb. 27, 2007
 [*]   Notice: Subject to any disclaimer, the term of this
           Patent is extended or adjusted under 35
           U.S.C. 254(b) by 482 days.--

Signed and Sealed this

Fourth Day of September, 2007

JON W. DUDAS
*Director of the United States Patent and Trademark Office*